(12) United States Patent
Mandal

(10) Patent No.: US 6,891,134 B2
(45) Date of Patent: May 10, 2005

(54) INTEGRALLY FORMED BAKE PLATE UNIT FOR USE IN WAFER FABRICATION SYSTEM

(75) Inventor: Robert P. Mandal, Saratoga, CA (US)

(73) Assignee: ASML Netherlands B.V. (NL)

( * ) Notice: Subject to any disclaimer, the term of this patent is extended or adjusted under 35 U.S.C. 154(b) by 0 days.

(21) Appl. No.: 10/364,125

(22) Filed: Feb. 10, 2003

(65) Prior Publication Data

US 2004/0155026 A1 Aug. 12, 2004

(51) Int. Cl.[7] .................................................. H05B 3/68
(52) U.S. Cl. ................................. 219/465.1; 219/444.1
(58) Field of Search ........................... 219/443.1, 444.1, 219/465.1, 466.1, 468.2, 543, 544, 546, 547, 548; 118/724, 725

(56) References Cited

U.S. PATENT DOCUMENTS

| | | | | | |
|---|---|---|---|---|---|
| 3,436,816 | A | * | 4/1969 | Lemelson | ..................... 29/611 |
| 3,790,355 | A | * | 2/1974 | Palisin, Jr. | ................... 428/623 |
| 3,813,519 | A | * | 5/1974 | Jochim et al. | ............... 219/522 |
| 5,034,688 | A | * | 7/1991 | Moulene et al. | ............. 324/760 |
| 5,166,856 | A | * | 11/1992 | Liporace et al. | ............. 361/233 |
| 5,904,872 | A | * | 5/1999 | Arami et al. | ............. 219/444.1 |
| 6,180,931 | B1 | * | 1/2001 | Futakuchiya et al. | ....... 219/544 |
| 6,416,318 | B1 | | 7/2002 | Lee et al. | |
| 6,423,949 | B1 | * | 7/2002 | Chen et al. | ............... 219/444.1 |

\* cited by examiner

*Primary Examiner*—Sang Paik
(74) *Attorney, Agent, or Firm*—Blakely Sokoloff Taylor & Zafman

(57) ABSTRACT

A bake plate is integrally formed from a copper disk whose lower surface defines a desired heater element channel pattern that is filled with electrically conductive resistive material. Copper contamination is prevented by coating the structure. The channel pattern and fill material may be tailored to optimize thermal uniformity across the bake plate surface, and to produce a bake plate that may be mass produced with substantially uniform and repeatable thermal characteristics.

19 Claims, 4 Drawing Sheets

US 6,891,134 B2

INTEGRALLY FORMED BAKE PLATE UNIT FOR USE IN WAFER FABRICATION SYSTEM

FIELD OF THE INVENTION

The invention relates generally to bake plate units used to elevate wafer temperature in a wafer fabrication system, and more specifically to improving the consistency and reproducibility of the thermal characteristics of such bake plate units and longevity of the bake plate units, especially within a post exposure bake module.

BACKGROUND OF THE INVENTION

Modern integrated circuits (ICs) are fabricated on semiconductor wafers that are mass produced in fabrication sites. The fabrications sites (or "fabs") employ various types of automatic equipment that must function to very exacting and carefully controlled operating parameters. FIG. 1 depicts some of the process steps that are carried out.

At the upper left region of FIG. 1, a sequence of wafers come into a so-called wafer track system 10. A chill plate 20 typically is used to stabilize the wafer temperature by about 0.2° C. to room temperature before the wafers enter a spin coater 30 where a film of polymer photoresist is placed on the upper surface of the wafer. In some processes, at step 30 an anti-reflection coating may first be deposited upon the upper wafer surface and the wafer then baked (e.g., step 40) and then placed in the spin coater 30 for deposition of photoresist. In some processes an additional top layer of anti-reflection film may also be added at step 30. At modern photolithography seeks to define smaller and smaller feature size using shorter wavelength light, ultraviolet reflectivity becomes a greater problem, and thus the use of anti-reflection layer(s).

Eventually the wafer is robotically passed to a bake plate 40 where the film of photoresist is hardened and excess solvents are driven out of the wafer with heat. A subsequent chill plate process 50 cools the wafers to a stabilized room temperature, after which the wafers are presented to an exposure tool 60 that typically includes stepper and scanner functions. At step 70, the wafers are subjected to a post-exposure bake (PEB), using a PEB bake plate, and then to a chill plate 80, that returns the wafers to a stabilized ambient room temperature. A developer module stage 90 typically follows, during which the latent lithographic image that was formed during the exposure tool stage 60 is now developed in the polymer film on the wafer upper surface. In a positive tone image, the portions of the photoresist exposed to light will become soluble and dissolve away in solution to expose desired regions of the wafer structure. A bake plate step 100 follows the dry and harden the wafer surface. An etcher step 110 then follows, and then a cassette of the thus-processed wafers is returned to a chill plate, e.g., step 20. Various of the steps or stages shown in FIG. 1 may be repeated for the same wafer dozens of time, depending upon the specifics of the processes involved.

The goal in any fab is to produce wafers with the smallest possible feature size, and with a high production yield exceeding 80%. Meeting this goal requires that contaminants in the fab are controlled and that production parameters are controlled to where a substantial number of the wafers fully meet specification.

Fabrication variations due to lithography have decreased in recent years, thanks in part to the use of shorter wavelength light sources during the exposure tool phase of wafer fabrication. While use of 248 nm laser light promotes small element definition during fabrication, the decreased intensity of such light sources increases system throughput, as longer exposure times are required. The user of such laser wavelengths reduces throughput for system 10 to perhaps 160 wafers per hour. As a result, substantial work in the prior art has been directed to improving photoresists, including development of amplified (or chemically catalyzed) photoresists. Such photoresists essentially permit one photon of light source energy to affect multiple molecules within the photoresist material, thus reducing system throughput time. One consequence of enhanced performance from exposure tool step 60 is that post-exposure bake step 70 becomes a substantial factor in achieving specification with respect to critical dimensions in defining wafer patterns. Generally speaking, the post-exposure bake step now represents from perhaps 50% to 60% of the error contributed by system 10 in achieving critical dimensions in wafer production. (Perhaps 25% of the remaining error is associated with developer module 90, and perhaps 15% from spin coater 30.)

The challenge in designing a PEB bake plate is to achieve high uniformity in the ability to achieve and maintain within specification a desired and reproducible PEB temperature over a given period of time. The design goal is made difficult by the fact the spin coater 30 typically can accommodate many different types of photoresists, each requiring a different PEB bake plate temperature and time regime. Users of system 10 want a PEB unit 70 that can be rapidly programmed to accommodate different thermal set points for different photoresists.

Achieving good thermal uniformity across a PEB bake plate that is perhaps 13" (33 cm) in diameter has been a difficult challenge in the prior art. The PEB bake plate typically functions within an enclosure that can be exhausted by a vacuum system. The temperature uniformity across the face of a PEB bake plate should be within ±0.1° C., a specification that is often not met in industry. Difficult as this uniformity specification has been to meet, ideally uniformity across the bake plate face should preferably be within ±0.05° C., a goal that appears rather unattainable in the prior art.

FIG. 2A depicts a prior art bake plate 150 as may be used within a PEB module 70 and/or any or all of bake plate modules 40 and 100 in FIG. 1. Bake plate 150 includes a disk 160 of a thermally conductive material, typically aluminum, whose underside defines grooves or recesses 170 into which a coil of resistive wire 180 is inserted. A disk 190 of aluminum is then bonded to the underside of disk 160. An electrical power source Vs is coupled to each end of wire 180. Electrically current flowing through wire 180 generates heat, similarly to the operation of a kitchen toaster, and in this fashion bake plate 150 can be heated. A robotically controlled platform 200 is coupled to a plurality of lift pins 210 that can pass vertically through opening 220 in bake plate 160. A wafer 230 is robotically placed atop pins 210, and can be lowered to be in thermal contact with the upper surface of bake plate 150 by moving mechanism 200 downward. Non-unitary construction bake plates such as shown generically in FIG. 2A are manufactured by Watlow of Chicago, Ill.

Resistive wire heater 180 is essentially permanently enveloped between aluminum elements 160 and 190 during casting of the aluminum. Although thermal paste or adhesive (not shown) is used within cavities 170 to help bond with the heater wire, it is difficult to maintain a consistent thermal interface between portions of the wire and the interior of the cavities 170. In some regions the interface may be relative good but less good in other regions, perhaps due to inconsistency in the physical dimensions of the wire or grooves. Further, initial good thermal contact may deteriorate with time, with the result that long term stability and predictability of bake plate 160 is questionable.

FIG. 2B depicts a somewhat similar bake plate 250 of a type manufactured by Minco (a Minnesota company) and Joeun Technology (a Korean company). Bake plate 250 includes an aluminum disk 260 that has resistive thin film heater elements 270 encased within low thermal conductivity polyimide sheets 290. The heater elements generate heat when coupled to a voltage source Vs. Unfortunately bake plate 250 is laminated and is subject to delamination in use, e.g., sheets 290 can come loose from disk260, rendering the bake plate useless for a wafer fabrication application.

As noted, prior art bake plates such as shown in FIGS. 2A and 2B have a difficult time meeting the present ±0.1° C. design specification, let alone the future anticipated specification of ±0.05° C. Further, consistency and reproducibility of the thermal characteristics of such bake plates is needed, as is longer bake plate longevity.

The present invention provides an integrally formed bake plate with improved thermal characteristics, improved thermal consistency and reproducibility, and enhanced longevity.

SUMMARY OF THE INVENTION

The present invention provides an integrally formed bake plate by etching a desired heater element pattern into the lower surface of a machined preferably copper plate, whose upper surface will contact and heat a wafer. A pattern is formed in the lower plate surface defining grooves or channel regions where a heating element structure will be located. Through holes for lift pins are machined, and plate surfaces are coated, preferably with electroplated nickel and CVD diamond-like film to prevent problems associated with copper migration. Electrically resistive material, such as wires or other conductive material, which may include conductive paste, is placed in the defined grooves, for example using thick film printing techniques for paste. Plate sides and back surfaces can be covered with a protective film of polyimide that is then cured. Preferably a backplane containing cooling tubing is formed and placed in contact with the underside of the plate for rapid temperature setpoint changes.

The superior thermal conductivity of copper over aluminum enhances efficiency of the bake plate. Different regions of the plate may have, if required, differently shaped or sized grooves and/or conductive paste with different resistive characteristics. In this fashion the thermal characteristics of the bake plate can be made quite uniform, and bake plates can be mass produced relatively economically, with thermal characteristics that are repeatable.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 2A:
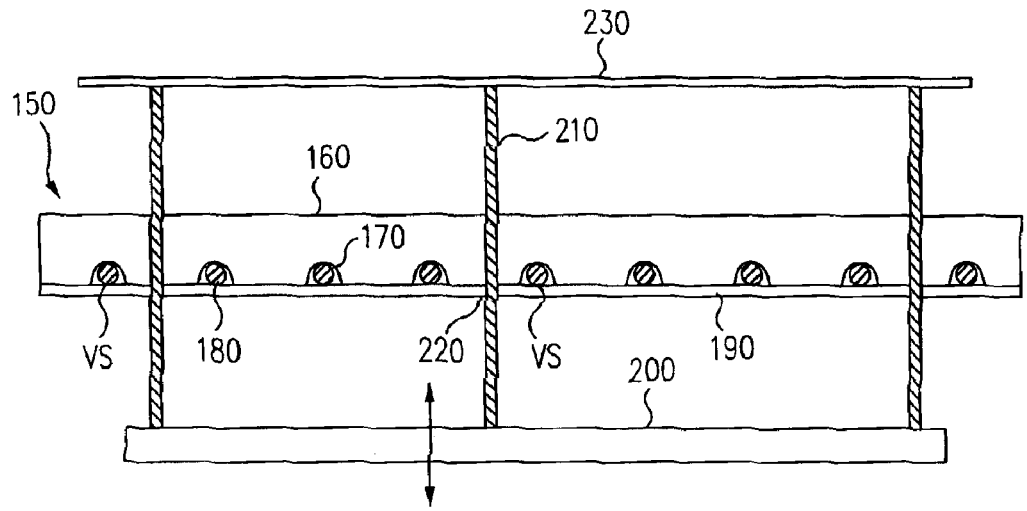
FIGS. 2A and 2B depict in cross-sectional view non-integrally formed bake plate units, according to the prior art.
Figure 2B:
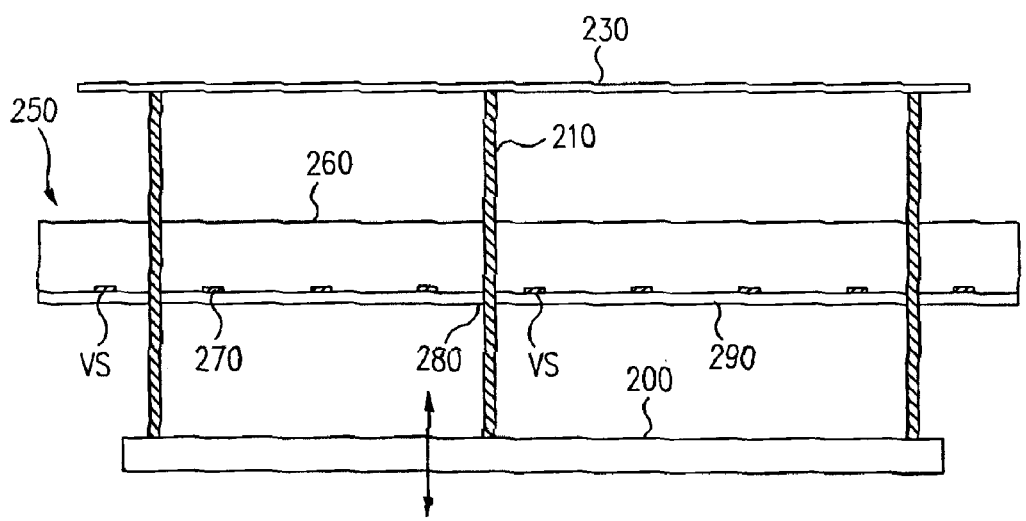
Figure 3:
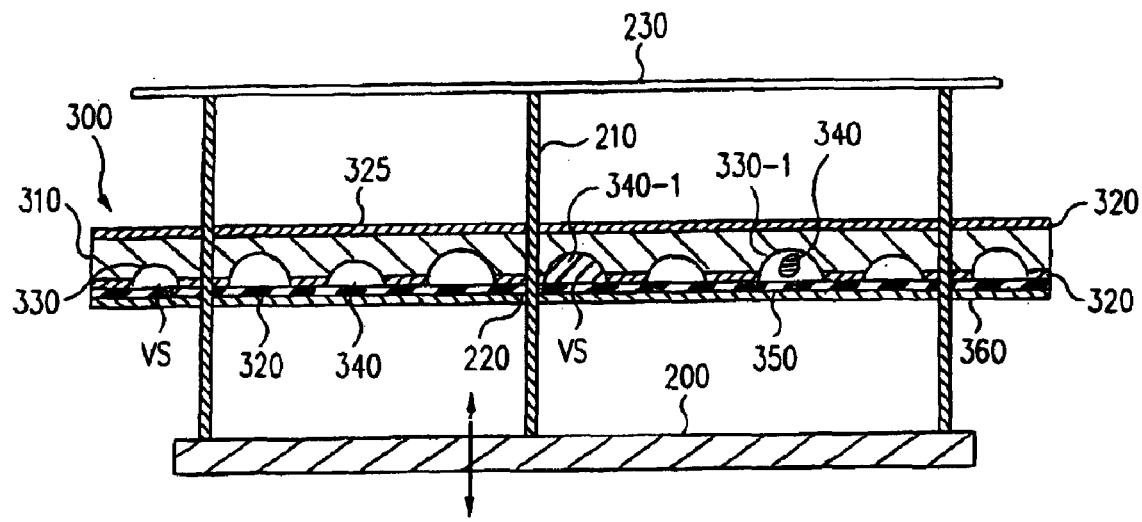
FIG. 3 depicts in cross-sectional view an integrally formed bake plate unit, according to the present invention.
Figure 4:
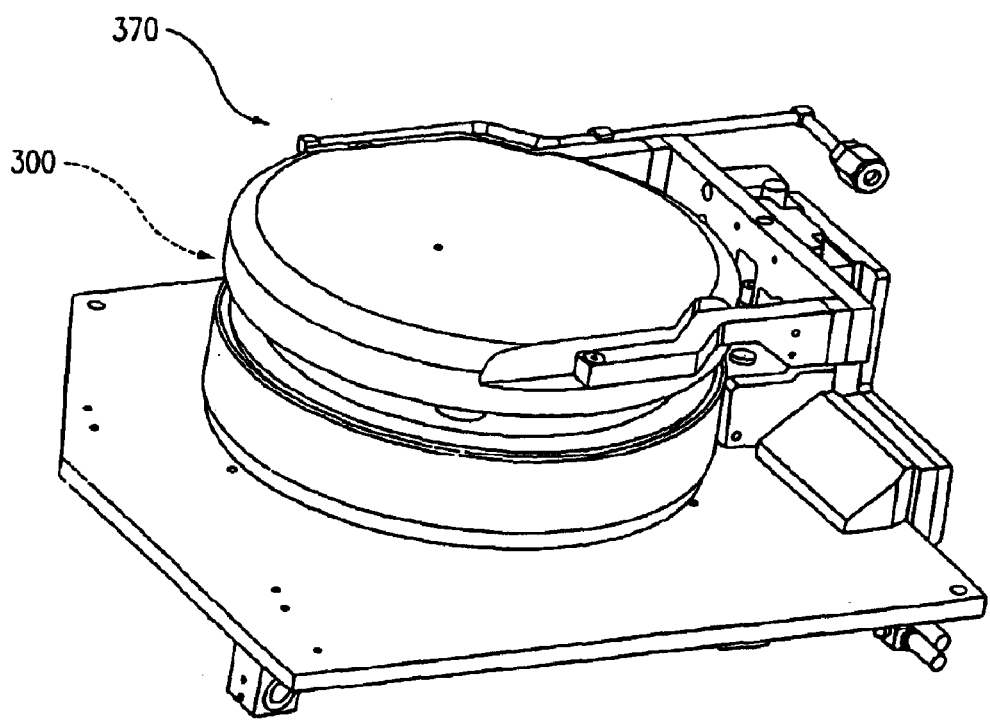
FIG. 4 depicts an openable chamber that houses a bake plate, according to the present invention.
Figure 5:
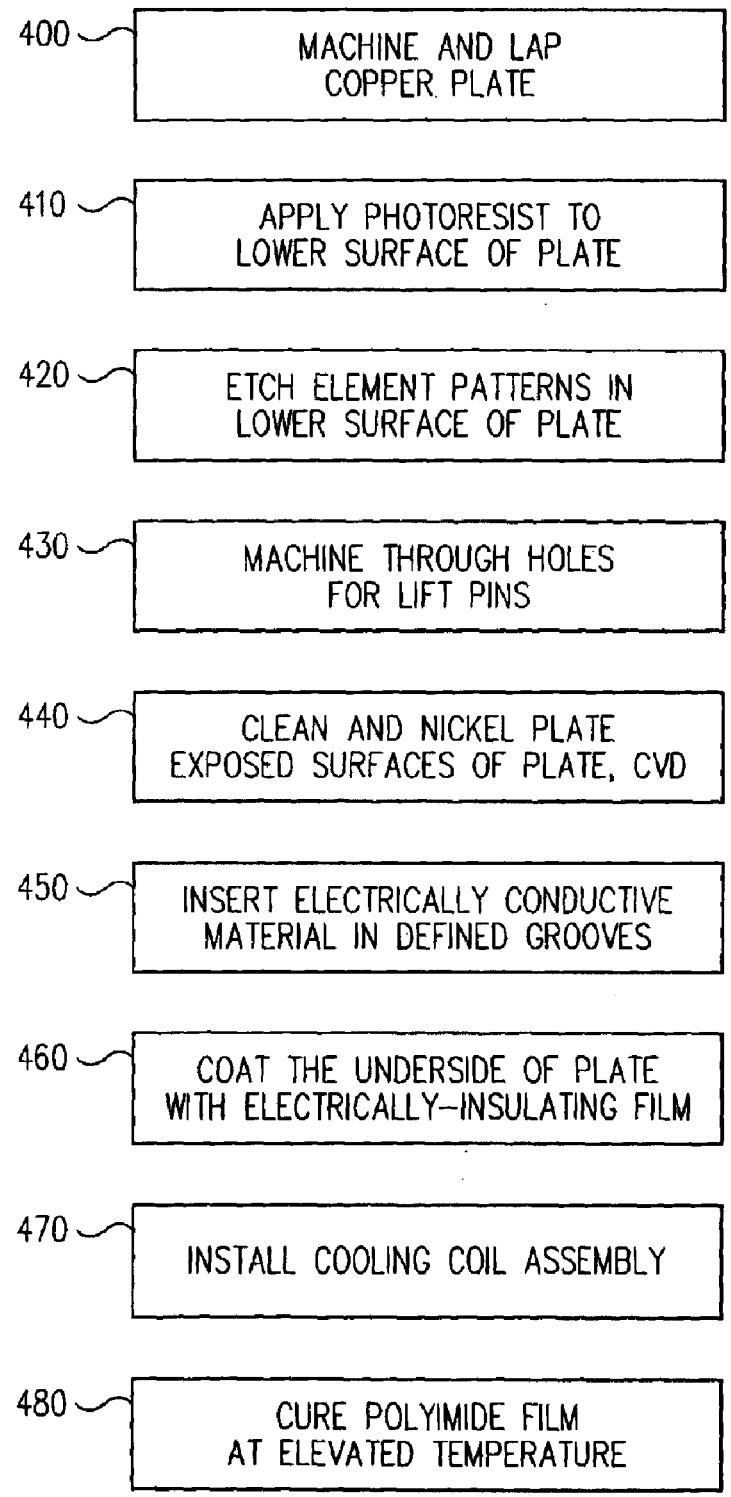
FIG. 5 depicts exemplary method steps used to product a bake plate, according to the present invention.

FIG. 3 depicts an integrally fabricated bake plate 300, according to the present invention. Reference numerals repeated from FIGS. 2A and 2B may be understood to represent similar elements. Thus, element 230 in FIG. 3 is the wafer to be heated when lift pins 210 are lowered vertically by a robotic mechanism 200. FIG. 4 depicts an openable chamber 370 in which a bake plate 300, according to the present invention is situated. FIG. 5 depicts major steps involved in fabricating a bake plate, according to the present invention.

Figure 1:
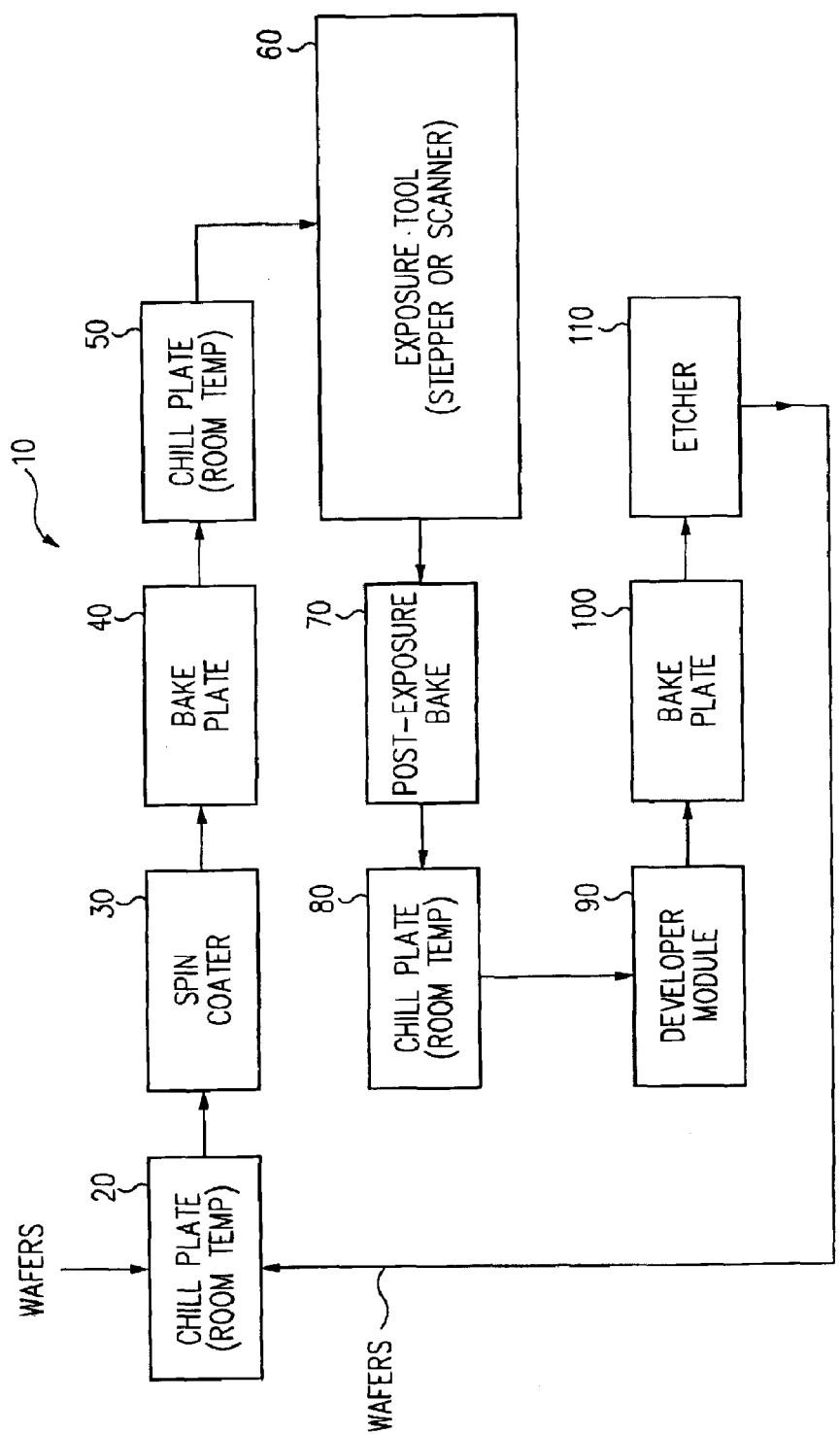
FIG. 1 is a block diagram depicting generic wafer process steps and modules, according to the prior art.

In FIG. 3 and at method step 400 in FIG. 5, the plate disk 310 is formed to specification, preferably using copper, rather than aluminum, as copper has about twice the thermal conductivity of aluminum. An advantage of using copper with its excellent thermal characteristics is that performance of a system 10 (as shown in FIG. 1) can be enhanced in that the bake plate 300 within a PEB module 70 (or other bake plate unit) can more readily attain and maintain the desired temperature. Other thermally conductive materials beside copper could of course be used, including siliver, if cost were no object. Copper typically is not commonly found in fabs because of contamination problems associated with copper migration. However copper disk 310 (which is about 33 cm diameter by about 15 mm or more thick) preferably is coated with an electroplated or sputter-formed layer of nickel and CVD diamond-like film 320. Although not depicted for ease of illustration in FIG. 3, the nickel layer also forms on the sides of the copper material. Alternatively, tungsten or molydenum could be used as a sputter material to encase the copper disk.

Referring to FIG. 5, step 410, preferably photoresist is applied to the lower surface of copper disk 310 and a pattern that defines where heater elements are to be located is formed, and then developed. In FIG. 3, channel regions 330, 330-1 depict the after-etching structure. Preferably dry film photoresist such as DuPont brand Riston is used. This material promotes contact-printing in that a clear thin plastic film coats the photoresist surface but is peeled-off before pattern development. Alternative photoresist techniques could of course be used.

At method step 420 in FIG. 5, the desired pattern is then physically formed into the lower copper surface, for example using etch techniques, with protective etch-stop applied to the top and side surfaces of disk 310. The layout design of the heater element pattern is selected to promote high temperature uniformity across the upper surface of the finished bake plate 300. As noted later herein, the design layout is based upon computer thermal models, and preferably will provide for two-zone or three-zone heating. Once etching of the channel regions 330, 330-1, etc. has been completed and the etched patterns have been inspected, all resist and etch-stop is stripped away from the structure. Dimensions and shape-configurations for channel regions 330, 330-1, etc. will be determined by the design specification but transverse dimensions on the range of perhaps 3 mm to perhaps 6 mm would be typical. It is understood that heat distribution across the upper surface of the bake plate will be affected by the location of through-openings for the lift pins, by proximity to the outer plate perimeter, etc. Thus in planar view, the pattern for the channel regions will typically not be a perfectly symmetrical spiral, and could, for example, also be in the form of a meander pattern.

The cross-sectional view of FIG. 3 shows groove-like channels denoted 330 extending from the lower surface of disk 310 inward. If viewed planarly, the channels preferably would define a continuous path, perhaps a serpentine path, into which electrically conductive material will be placed. It is understood that an advantage of the pattern and etch formation of channels 330 is that great flexibility exists. Note for example that if desired, for considerations of thermal conductivity for example, not all channel regions need be identical in shape. Channel region 330-1, for example, is shown larger than the other channels 330.

At method step 430 in FIG. 5, through openings 220 sized to pass lift pins 210 may next be machined into disk 310, as well as other appropriate features, recesses, etc. At method step 440, the disk structure is cleaned and the electroplated nickel layer 320 applied. Nickel forms a very good barrier film on copper and is an especially easy material to electroplate. At the etched channel regions 330, 330-1, etc., electroplating dynamics resulting from electric field configurations at the plate surface advantageously tend to make the sidewalls of the channel regions more vertical.

Further at method step 440, the upper surface of the disk is now coated with a deposited diamond-like layer 325, for example using chemical vapor deposition (CVD). Although not shown for ease of illustration in FIG. 3, the sides of disk 310 will also be coated with layer 325, but to a thinner depth.

Advantageously CVD diamond-like film has very high hardness, lubricity approaching that of Teflon, and thermal conductivity 2.56 times that of copper CVD diamond-like film deposition materials are commercially available, for example from Diamonex, Inc. of Allentown, Pa.

At this juncture, the channels 330 will be filled with a material that conducts current from a power source Vs, and that heats resistively in response to the current flow. Several different techniques may be used at this point, and method step 450 in FIG. 5 will be understood to encompass the following techniques.

In one technique to fill the etched channel grooves, the bottom surface of the bake plate disk is coated with a deposition of CVD diamond-like film, or with a deposition of sputtered aluminum oxide deposited before coating the upper surface of the disk with CVD diamond-like film 325. In this embodiment, nichrome heater wire is then manually urged into the etched recess paths 330 in the lower disk surface. In this embodiment, reference numeral 340 in FIG. 3 would refer to such heater wire. A uniform film nonconductive polyimide is then formed into the etched recesses 330 over the nichrome heater wire 340, and cured by heating the heat plate at elevated temperature. The film of nonconductive polyimide could be applied using thick film printing techniques that employ a fine stainless steel screen with resist blocking non-etched areas, and a squeegee. Layer 360 in FIG. 3 would then represent this polyimide film.

In a second technique to fill the etched channel grooves, a thick film printing technique can be used to apply a film, which may be uniform, of conductive polyimide or brazing alloy paste into the etched recesses, after which insulated heater wire would manually be pressed into the etched recess paths in the plates. The heater wires would preferably be insulated with an inorganic insulator. By way of example, aluminum and silicon form a eutectic at 88.3% Al: 11.7% Si melting at 577° C. Addition of additional silicon can form a precipitated composite of silicon grains suspended in Al/Si eutectic. Oxidation of the surface of the electrically-resistive composite could form an integrated coating of aluminum silicate type electrically-insulating film, somewhat similar to the mullite ceramic used for high temperature furnace liners. Alternatively, another type of resistive wire coated with deposited inorganic insulation could be used. Polyimide-coated resistance wire could be considered in conjunction with conductive polyimide adhesive. The screen-printed film is then cured, for example by heating the plate to elevated temperature.

A third technique to fill the etched channel grooves offers enhanced flexibility and deposits integrated thin film or thick film resistor heater element into the grooves. The element material can be applied as a paste or slurry, and advantageously forms intimate contact with the interior surface of the channel regions 330. Whereas heater wire tends to have a uniform cross-section and uniform thermal characteristics along the wire length, but the heater material 340 is formed from a paste, great flexibility is available. As shown by heater material 340 within channel region 330-1, if the channel region is larger than other channels, then more heater material 340 is used to fill that channel. As shown by heater material 340-1, if desired, the thermal characteristics of the paste material can be made non-uniform, in an attempt to obtain more uniform thermal characteristics across the heating upper surface of bake plate 300. Resistive characteristics of material 340, 340-1, etc. can be made to vary from perhaps 100 ohms/square to 5,000 ohms/square.

Electrically-insulating CVD diamond-like films or sputtered aluminum oxide films could be used for insulation. Sputtered thin film chromium silicide heater element films could be deposited and patterned by resist lift-off, by etching, or by lapping. Most screen-printable resistor and insulator formulations typically require firing at temperatures of at least 500° C., which may be high for the present invention. Brazing alloys in the form of pastes could be considered for material 340, for example 75 wt. % gold/25 wt. % antimony eutectic melting at 360° C. or 73 wt. % gold/27 wt. % indium eutectic melting at 451° C. Nonconductive polyimide would be subsequently screen-printed over the brazing alloy heater elements for electrical insulation.

Screen-printable thermosetting thick film paste formulations could also be used, and comprise a mixture of two discrete binary alloys that further alloy at a relatively low temperature to form a resultant high temperature alloy. For example, 52 indium/48 tin eutectic melts at 118° C. Such a low-melting solder paste could be mixed with, for example, either 50 copper/50 nickel (50 micro ohm-cm resistivity) or 30 copper/70 palladium (47 micro ohm-cm resistivity) or 40 silver/60 palladium (42 micro ohm-cm resistivity) or nickel/silver alloy. Heating at a convenient temperature would cause melting indium/tin to alloy with the high temperature-melting alloy, resulting in a composite high temperature-melting corrosion-resistant solderable alloy with high resistivity. Nonconductive polyimide or a low temperature thick film glaze can be subsequently screen-printed over the alloyed heater elements for electrical insulation. Although polyimide-based resistor paste materials exist, their present lack of long-term stability may make such materials undesirable in the present invention.

The serpentine or other shape (when bake plate 300 is viewed planarly) of the channel path 330 typically is determined using computer software. In the initial design of the bake plate, some trial and error work in redefining the specific channel path design, channel path dimension at various regions on the bake plate, and the thermal characteristics of the paste or other material 340, 340-1, etc. However once the design has been fine-tuned, bake plate 300 can then be mass produced at relatively low cost (e.g., perhaps $5,000 per unit contrasted with $10,000 to $40,000 per unit for prior art configurations exemplified by FIGS. 2A and 2B.

Referring to FIG. 5, step 460, the underside of plate 310 is next coated with an electrically insulating film, 350. At method step 470, a cooling coil assembly 360 is added. During fabrication different photoresists may used on wafer 230, each photoresist perhaps requiring a different temperature regime. It is desired that a bake plate be able to transition relatively rapidly from one such temperature regime to another, for example to be able to change 20° C. within three minutes and still obtain the desired good temperature consistency across the upper surface of the bake plate. Finally at step 480 in FIG. 5, the polyimide film associated with the cooling assembly is cured using elevated temperature, perhaps 350° C. for a period of time.

Independently of the above techniques and procedures to form bake plate 300, a cooling plane element denoted as 360 in FIG. 3 may be formed. (Although bake plate 300 is intended to elevate temperature of wafer 230 uniformly, it is also desired to execute rapid temperature set-point changes.) A planar spiral tubular backplane may be formed by winding an appropriate length of tubing into a planar spiral, through which coolant (for example water, a cooling gas, etc.) will be passed to cool wafer 230. The tubing material is preferably corrosion-resistant, and could comprise nickel tubing, stainless steel tubing, and aluminum/silicon eutectic alloy, among other materials.

The planar spiral tubing is placed on a flat plate with cylindrical bodies extending loosely upward through the flat plate, accurately corresponding to locations of the lift pins and other features. A second flat plate is then placed over the assembly and a hydraulic press is used to partially flatten the planar spiral tubing. Preferably flattening would form an elliptical cross section in which the major axis was about twice the length of the minor axis, to enhance thermal coupling while yielding a more compact form factor. The plate used to sandwich the planar spiral tubular backplane during flattening would have an opening located off-center to allow the inner terminus of the planar spiral tubular backplane to extend through the plate.

Planar spiral tubular backplane 360 serves primarily to provide a thermally coupled element to implement rapid bake plate cooling for temperature set-point changes as part of fab process recipe changes. Advantageously, this backplane also provides some measure of thermal insulation and physical protection for the lower surface of bake plate 300, and can also help accommodate disparate thermal expansion and contraction.

Returning now to fabrication of bake plate 300 per se, a thick film printing technique, using a fine stainless steel screen and a squeegee preferably is used to apply a uniform film of conductive polyimide 360 to the under surface of bake plate 300 (without covering any machined through hole openings). Although not shown in FIG. 3 for ease of illustration, the vertical side surfaces of the bake plate are coated with a polyimide film before coating the under surface. The planar spiral tubular backplane is then pressed onto the heater plate, with care to align lift pin opening locations. The polyimide is then cured, preferably heating the bake plate 300 assembly at elevated temperature.

Modifications and variations may be made to the disclosed embodiments without departing from the subject and spirit of the invention as defined by the following claims.

What is claimed is:

1. A bake plate for use in a wafer production fab, the bake plate comprising:
   a disk of thermally conductive material having an upper surface and a lower surface; and
   said lower surface defining at least one continuous channel pattern fillable with electrically conductive resistive material, the channel pattern having a non-uniform depth when viewed on a plane orthogonal to the upper surface of the disk; and
   an electrically conductive resistive material, disposed to fill said channel pattern in said lower surface;
   said electrically conductive resistive material generating heat when coupled to a source of electrical power such that a wafer in contact with said upper surface is heated substantially uniformly across said upper surface.

2. The bake plate of claim 1, wherein said thermally conductive material is copper and further comprising an insulating material between the copper and the electrically conductive resistive material.

3. The bake plate of claim 1, wherein said electrically conductive resistive material is resistive paste having uniform resistivity across a continuous length of said channel pattern.

4. The bake plate of claim 1, wherein said electrically conductive resistive material is resistive paste selected to have a varying resistivity across a continuous length of said channel pattern.

5. The bake plate of claim 1, wherein said channel pattern has, when viewed on a plane orthogonal to said upper surface, a uniform area.

6. The bake plate of claim 1, wherein said channel pattern has, when viewed on a plane orthogonal to said upper surface, a a non-uniform area.

7. The bake plate of claim 1, wherein said thermally conductive material is copper and surfaces of said copper include a layer of nickel formed by at least one of (a) electroplating, and (b) sputtering.

8. The bake plate of claim 1, wherein outermost surfaces of said bake plate are covered with a chemical vapor deposition of diamond-like film.

9. The bake plate of claim 1, further including means for reducing temperature of said bake plate, said means for reducing disposed in contact with said lower surface.

10. A bake plate for use in a wafer production fab, the bake plate comprising:
    a disk of copper having an upper surface and a lower surface;
    said lower surface defining at least one continuous channel pattern fillable with electrically conductive resistive material, the channel pattern having a non-uniform depth when viewed on a plane orthogonal to the upper surface of the disk; and
    an electrically conductive resistive material, disposed to fill said channel pattern in said lower surface and being electrically insulated from the disk of copper;
    wherein at least one of shape of said pattern and resistivity of said resistive material are selected to minimize thermal variation across said upper surface;
    said electrically conductive resistive material generating heat when coupled to a source of electrical power such that a wafer in contact with said upper surface is heated substantially uniformly across said upper surface.

11. The bake plate of claim 10, wherein said electrically conductive resistive material has at least one characteristic selected from a group consisting of (a) said material is wire, (b) said material is resistive paste having uniform resistivity across a continuous length of said channel pattern, (c) said material is resistive paste having non-uniform resistivity across a continuous length of said channel pattern.

12. The bake plate of claim 10, wherein said channel pattern has, when viewed on a plane orthogonal to said upper surface, at least one of uniform areas, and a non-uniform area.

13. The bake plate of claim 10, wherein surfaces of said disk include a layer of nickel formed by at least one of (a) electroplating, and (b) sputtering.

14. The bake plate of claim 10, wherein outermost surfaces of said bake plate are covered with a chemical vapor deposition of diamond-like film.

15. The bake plate of claim 10, further including means for reducing temperature of said bake plate, said means for reducing disposed in contact with said second surface.

16. A method of producing a bake plate for use in a wafer production fab, the method comprising the following steps:

providing a disk of thermally conductive material sized to heat a wafer, said disk having an upper surface and a lower surface;

defining at least one length of channel pattern within said lower surface, the channel pattern having a non-uniform depth when viewed on a plane orthogonal to the upper surface of the disk; and filling said channel pattern with an electrically conductive material that when coupled to a source of voltage generates heat.

17. The method of claim 16, wherein said channel pattern has, when viewed on a plane orthogonal to said upper surface, at least one of uniform areas and a non-uniform area.

18. The method of claim 16, wherein said thermally conductive material is copper, the electrically conductive material is electrically insulated from the copper, and the method further includes covering surfaces of said copper with a layer of nickel.

19. The method of claim 16, further including covering at least one outermost layer of said bake plate with a film of diamond-like material.

* * * * *